(12) United States Patent  (10) Patent No.: US 8,545,622 B2
Nakai et al.  (45) Date of Patent: Oct. 1, 2013

(54) ANNEALED WAFER AND MANUFACTURING METHOD OF ANNEALED WAFER

(75) Inventors: Katsuhiko Nakai, Hikari (JP); Koji Fukuhara, Hikari (JP)

(73) Assignee: Siltronic AG, Munich (DE)

( * ) Notice: Subject to any disclaimer, the term of this patent is extended or adjusted under 35 U.S.C. 154(b) by 1114 days.

(21) Appl. No.: 11/645,017

(22) Filed: Dec. 22, 2006

(65) Prior Publication Data

US 2007/0155134 A1  Jul. 5, 2007

(30) Foreign Application Priority Data

Dec. 27, 2005  (JP) ................................. 2005-376306

(51) Int. Cl.
*C30B 15/02* (2006.01)

(52) U.S. Cl.
USPC ................................. 117/13; 117/28; 117/33

(58) Field of Classification Search
USPC ............................. 117/13, 28, 51, 54, 45, 33
See application file for complete search history.

(56) References Cited

U.S. PATENT DOCUMENTS

| 5,593,494 | A | * | 1/1997 | Falster ............... 117/2 |
| 5,935,320 | A |   | 8/1999 | Graef et al. |
| 6,129,787 | A | * | 10/2000 | Adachi et al. ............... 117/89 |
| 6,159,438 | A | * | 12/2000 | Iida et al. ............... 423/328.2 |
| 6,191,009 | B1 | * | 2/2001 | Tamatsuka et al. ........... 438/471 |
| 6,364,947 | B1 | * | 4/2002 | Iida et al. .................. 117/206 |
| 6,514,335 | B1 | * | 2/2003 | Egashira et al. ............... 117/13 |
| 6,544,490 | B1 |   | 4/2003 | Takeno et al. |
| 6,548,035 | B1 | * | 4/2003 | Kimura et al. ............. 423/328.2 |
| 6,548,886 | B1 |   | 4/2003 | Ikari et al. |
| 6,641,888 | B2 | * | 11/2003 | Asayama et al. ............ 428/64.1 |
| 6,805,742 | B2 |   | 10/2004 | Tachikawa et al. |
| 6,878,451 | B2 | * | 4/2005 | Asayama et al. ............. 428/446 |
| 7,273,647 | B2 | * | 9/2007 | Nishikawa et al. .......... 428/64.1 |
| 7,311,888 | B2 | * | 12/2007 | Takeno et al. .............. 423/328.2 |
| 7,518,187 | B2 | * | 4/2009 | Sakurada ..................... 257/347 |
| 2002/0017234 | A1 |   | 2/2002 | Ono et al. |
| 2002/0142170 | A1 | * | 10/2002 | Asayama et al. ............. 428/446 |
| 2002/0142171 | A1 | * | 10/2002 | Asayama et al. ............. 428/446 |
| 2002/0179003 | A1 | * | 12/2002 | Iida et al. ....................... 117/19 |

(Continued)

FOREIGN PATENT DOCUMENTS

EP  0942078  9/1999
EP  0962556  12/1999

(Continued)

OTHER PUBLICATIONS

V.V. Voronkov, The Mechanism of Swirl Defects Formation in Silicon, Journal of Crystal Growth, 59 (1982) 625-643.

(Continued)

*Primary Examiner* — Bob M Kunemund
(74) *Attorney, Agent, or Firm* — Leydig, Voit & Mayer, Ltd.

(57) ABSTRACT

An annealed wafer in which oxygen precipitation is uniform in the substrate plane and a manufacturing method thereof are provided. A nitrogen-doped silicon single crystal substrate pulled at the cooling rate of 4° C./minute or more during crystal growth between 1100 and 1000° C. wherein the nitrogen concentration is $1\times10^{14}$ to $5\times10^{15}$ atoms/cm$^3$ and V/G satisfies predetermined conditions serves as a substrate, and the substrate is subjected to heat treatment in a non-oxidative atmosphere.

16 Claims, 4 Drawing Sheets

(56) References Cited

U.S. PATENT DOCUMENTS

| | | | |
|---|---|---|---|
| 2003/0015131 A1* | 1/2003 | Iida et al. | 117/14 |
| 2003/0029375 A1 | 2/2003 | Watanabe et al. | |
| 2003/0116082 A1* | 6/2003 | Sakurada et al. | 117/20 |
| 2003/0157814 A1* | 8/2003 | Iida et al. | 438/795 |
| 2003/0175532 A1* | 9/2003 | Asayama et al. | 428/446 |
| 2004/0216659 A1* | 11/2004 | Asayama et al. | 117/2 |
| 2005/0098092 A1* | 5/2005 | Wilson et al. | 117/84 |
| 2006/0016387 A1* | 1/2006 | Yokoyama et al. | 117/84 |
| 2006/0075957 A1* | 4/2006 | Takeno et al. | 117/84 |
| 2007/0155134 A1* | 7/2007 | Nakai et al. | 438/471 |
| 2007/0178668 A1* | 8/2007 | Nakai et al. | 438/471 |

FOREIGN PATENT DOCUMENTS

| | | |
|---|---|---|
| EP | 1170404 | 1/2002 |
| EP | 1284311 A2 | 2/2003 |
| JP | 10098047 | 4/1998 |
| JP | 2000026196 | 1/2000 |
| JP | 2003029932 A | 2/2003 |
| JP | 2003059932 | 2/2003 |
| JP | 2003243404 | 8/2003 |
| TW | 593799 | 6/2004 |
| TW | I222469 B | 10/2004 |
| WO | WO 0224986 | 3/2002 |
| WO | 0224986 A3 | 6/2002 |

OTHER PUBLICATIONS

M. Iida et al., Effects of Light Element Impurities on the Formation of Grown-in Defects Free Region of Czochralski Silicon Single Crystal, Electrochemical Society Proceedings, vol. 99-1, p. 499-510 May 1999.

Y. Yatsurugi et al., Concentration, Solubility, and Equilibrium Distribution Coefficient of Nitrogen and Oxygen in Semiconductor Silicon, J. Electrochem. Soc.: Solid-State Technology, Jul. 1973, vol. 120, No. 7, p. 978.

T. Müller et al., Processing and Characterization of 300 mm Argon-Annealed Wafers, Diffusion and Defect Data, Part B (Solid State Phenomena), Baladan Publishers, Scitec Publication, vol. 95-96, 2004, p. 105-110.

T. Takahashi et al., Microvoid Defects in Nitrogen- and/or Carbon-Doped Czochralski-Grown Silicon Crystals, Japanese Journal of Applied Physics, Japan Society of Applied Physics, Tokyo, Japan, vol. 42, No. 2A Part 1, Feb. 2003, p. 363-370.

A. Ikari et al., Defect Control in Nitrogen Doped Czochralski Silicon Crystals, Diffusion and Defect Data, Solid State Data, Part B, Solid State Phenomena, Vaduz, vol. 69/70, Sep. 1999, p. 161-166.

W. v. Ammon et al., Influence of Oxygen and Nitrogen on Point Defect Aggregation in Silicon Single Crystals, Materials Science and Engineering B, Elsevier Sequoia, Lausanne, vol. 36, No. 1, Jan. 1996, p. 33-41.

Werner Zulehener and Diethart Huber, Crystal Growth, Properties and Applications, Czochraiski-Grown Silicon, Sprnger-Veriag, Berlin, Heidelberg, pp, 1, 28, 1982.

Kozo Nakamura, Formation process of grown-in defects in Czochralski grown silicon crystals, Journal of Crystal Growth, 1997, pp. 61-72, Elsevier Science B.V. Japan.

* cited by examiner

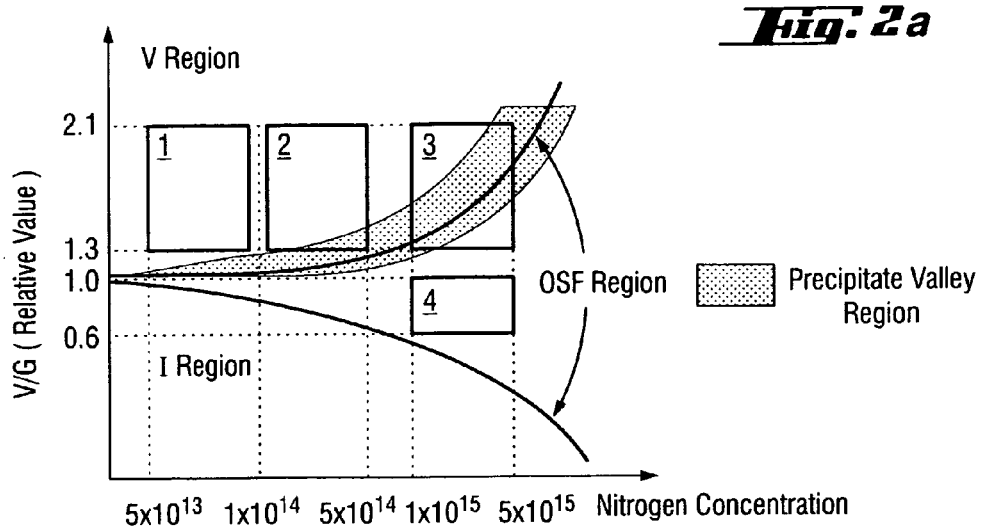
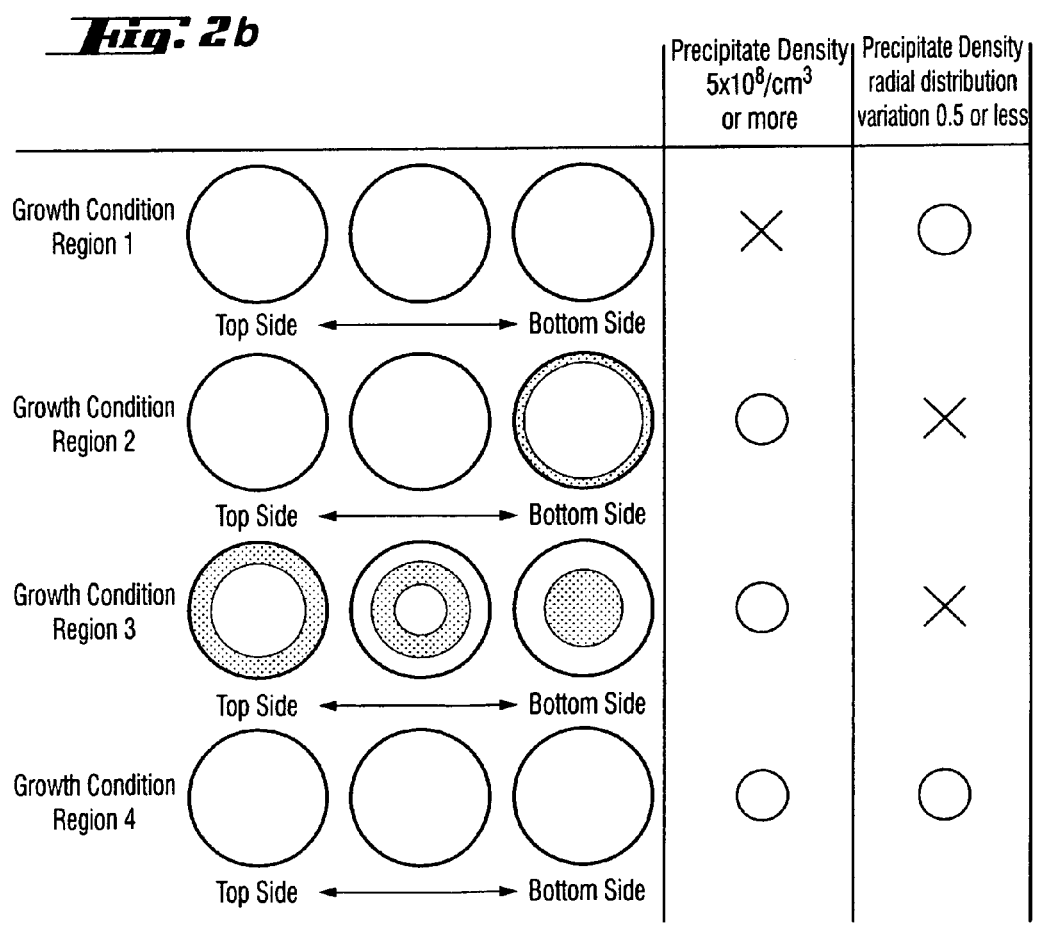

ANNEALED WAFER AND MANUFACTURING METHOD OF ANNEALED WAFER

RELATED APPLICATIONS

The present application claims the benefit of Japanese Patent Application, Serial No.2005-376306, filed on Dec. 27, 2005, the complete disclosure of which is hereby incorporated by reference herein in its entirety and for all purposes.

FIELD OF THE DISCLOSURE

The present disclosure relates to an annealed wafer and a method for manufacturing an annealed wafer.

BACKGROUND OF THE DISCLOSURE

Semiconductor substrates, particularly, silicon single crystal wafers (hereinafter, also simply referred to as "substrates") are used as substrates for fabricating highly-integrated MOS devices. Many of the silicon single crystal wafers are substrates which are obtained by slicing a silicon single crystal ingot manufactured by the Czochralski (CZ) method.

In such a silicon single crystal wafer, oxygen introduced during single crystal production is present in a supersaturated concentration. The oxygen is precipitated in later device processing, and oxygen precipitates are formed in the substrate. When a sufficient amount of the oxygen precipitates are present in the substrate, the precipitates getter heavy metals, which are introduced during the device processing, in the substrate. The precipitates have an effect of maintaining clean the substrate surface, which is a device active layer.

A technique to which such effect is applied is called intrinsic gettering (IG) and used for preventing characteristics deterioration due to heavy metal contamination. Therefore, an appropriate degree of oxygen precipitation is expected to occur during device processing in a silicon single crystal substrate.

In order to promote gettering ability, oxygen precipitates of at least a predetermined density or concentration are desired to be present in the center in the thickness of a silicon single crystal wafer. As a result of past tests, it is believed that when $5 \times 10^8$ or more oxygen precipitates per $cm^3$ are present midway between the surfaces of a silicon single crystal wafer, gettering ability for heavy metals, such as Fe, Ni, and Cu, is provided even in heat treatment in a low-temperature device processing wherein the highest temperature is equal to or less than 1100° C.

Meanwhile, silicon semiconductor substrates obtained by high-temperature heat treatment (hereinafter, referred to as "annealing") of silicon single crystal wafers (hereinafter, referred to as "annealed wafers") are widely used in fabrication of high-density highly integrated devices.

In the present disclosure, silicon single crystal wafers which have not undergone annealing before delivery are referred to as "mirror wafers," and substrates before undergoing annealing are referred to as "substrates" so as to distinguish them from each other.

It is believed that the annealed wafers do not have grown-in defects such as COP (Crystal Originated Particles) on the substrate surfaces and have desirable device characteristics, for example, GOI(gate oxide integrity) characteristics. This is because such grown-in defects as are present near the substrate surfaces are diminished or eliminated through high-temperature annealing, and, as a result, defect-free layers are formed in the regions within several micrometers from the surfaces.

However, the annealed wafers are also believed to have inferior gettering characteristics compared with the previously-described mirror wafers without epitaxial deposition. A conceivable reason is that, generally, oxygen precipitation nuclei are eliminated by annealing of 1100° C. or more, and therefore oxygen precipitation does not occur in the device processing thereafter.

Manufacturing methods of annealed wafers using nitrogen-doped substrates as substrates have been proposed as examples of methods which compensate for insufficient oxygen precipitation in the annealed wafers (see Patent Documents 1 and 2 below).

This is because, when nitrogen dopant is added, thermally stable oxygen precipitation nuclei are formed during crystal growth, and they are not diminished or eliminated even during an annealing step; thus, oxygen precipitates are generated based on such oxygen precipitation nuclei in device heat treatment after annealing. When such substrates are used as substrates, oxygen precipitation after annealing can be promoted.

However, as the diameter of recent annealed wafers is increased from 200 mm to 300 mm, a new requirement of oxygen precipitation characteristics has emerged. The requirement is to control the oxygen precipitate density to be uniform in a substrate plane. The reason is that, if there is a location where the oxygen precipitate density is low in the substrate plane, gettering ability at that area is lessened, which leads to less device yield. In order to manufacture an annealed wafer in which the oxygen precipitate density is uniform in the substrate plane, growth conditions of nitrogen doped crystals have to be precisely controlled. In conventional techniques, the growth conditions of the nitrogen doped crystals are not taken into consideration. Therefore, annealed wafers manufactured by such techniques do not resolve this issue because locations where oxygen precipitation densities are low are generated in the substrate plane therein (see Patent Documents 3 and 4 below).

Also, manufacturing methods of annealed wafers may provide for oxygen precipitation densities that are uniform in the plane (Patent Documents 5 and 6 below). Japanese Laid-Open Patent Application (kokai) No. 2003-59932 (which is hereby incorporated herein for all purposes) discloses a method in which V/G, which is one of crystal pulling parameters, is adjusted to within a certain range so that the entire substrate becomes a special region called an OSF region. Also, Japanese Laid-Open Patent Application (kokai) No. 2003-243404 (which is hereby incorporated herein for all purposes) discloses a manufacturing method in which the crystal pulling parameter V/G is restricted to a range between about 0.175 and about 0.225. However, in such methods, since the crystal pulling parameter V/G is limited to an extremely narrow range, control of crystal pulling becomes difficult, which is a factor that lowers yield. In particular, an issue is that, since the uppermost limit of the crystal pulling speed is regulated, the pulling speed cannot be sufficiently increased, and productivity is lowered.

As described above, it has been difficult to manufacture an annealed wafer in which the oxygen precipitate density is high and oxygen precipitates are uniformly distributed in the substrate plane.

[Patent Document 1]
Japanese Laid-Open Patent Application (kokai) No. 2000-26196 (which is hereby incorporated herein for all purposes)

[Patent Document 2]
Japanese Laid-Open Patent Application (kokai) No. 10-98047 (which is hereby incorporated herein for all purposes)

[Patent Document 3]
Japanese Laid-Open Patent Application (kokai) No. 2000-26196 (which is hereby incorporated herein for all purposes)

[Patent Document 4]
Japanese Laid-Open Patent Application (kokai) No. 10-98047 (which is hereby incorporated herein for all purposes)

[Patent Document 5]
Japanese Laid-Open Patent Application (kokai) No. 2003-59932

[Patent Document 6]
Japanese Laid-Open Patent Application (kokai) No. 2003-243404

BRIEF DESCRIPTION OF THE DRAWINGS

[FIG.1]
FIG. 1(a) is a graph showing the relation between the defect regions which are present in a substrate before epitaxial deposition and nitrogen concentration,
and FIG. 1(b) is a schematic drawing showing the defect regions and nitrogen concentration distribution in a silicon crystal ingot during pulling.

[FIG.2]
FIG. 2(a) is a graph showing the relation between the nitrogen concentration and V/G, and FIG. (2b) is a chart showing oxygen precipitate radial distribution in substrate plane, whether the oxygen precipitate density is equal to or more than $5 \times 10^8/cm^3$ or not, and whether the oxygen precipitate density radial distribution variation is equal to or less than 0.5 or not.

[FIG.3]
FIG. 3(a) is a graph showing the relation between the nitrogen concentration and V/G,
and FIG. 3(b) is a chart showing oxygen precipitate distribution in the substrate plane, whether the oxygen precipitate density is $5 \times 10^8/cm^3$ or not, and whether the oxygen precipitate density radial distribution is equal to or less than 0.5 or not.

[FIG.4]
FIG. 4(a) is a graph showing the relation between the nitrogen concentration and V/G, and FIG. 4(b) includes graphs showing results of densities of voids, which have a size of 50 to 150 nm in respective regions of A, B, and C, measured in the substrate radial direction.

DETAILED DESCRIPTION OF THE DISCLOSURE

Figure 1A:
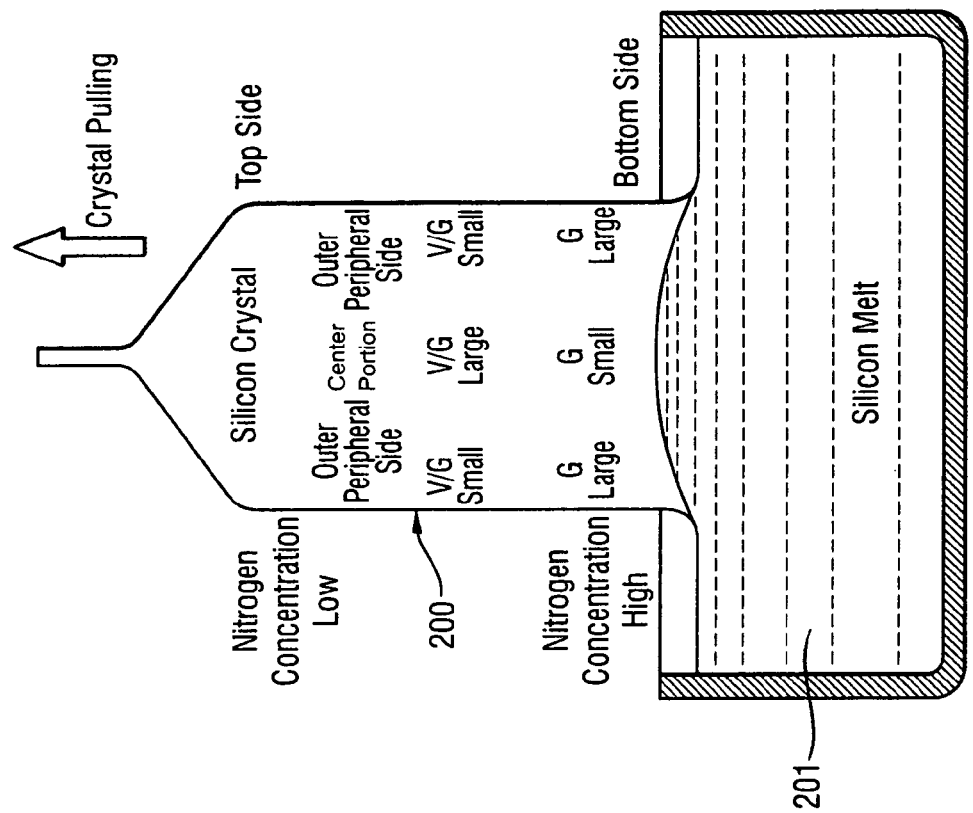
FIGS. 1(a) and 1(b) are explanatory drawings for explaining the relation between defect regions and a nitrogen concentration in a silicon ingot which is pulled in accordance with the CZ method. Herein.

[Characteristics of the Present Disclosure]
The present disclosure provides for an annealed wafer in which oxygen precipitation after annealing is sufficiently high and radial distribution of oxygen precipitate density is uniform and a method for manufacturing the annealed wafer.

[Providing for the Characteristics of the Present Disclosure]
The present inventors have carried out extensive studies of a method of manufacturing an annealed wafer that is free from the above described issues of conventional techniques, wherein oxygen precipitation after annealing is sufficiently high and the radial distribution of oxygen precipitate density is uniform. As a result, in view of the fact that the radial distribution of oxygen precipitates is closely related to defect regions of the substrate wherein growth conditions of a nitrogen-doped crystal are to be controlled, the present inventors have found that the radial distribution of oxygen precipitates can be made uniform by optimally controlling crystal growth conditions such as V/G during growth of the nitrogen-doped crystal resulting in the present disclosure.

Specifically, the present disclosure relates to
(1) an annealed wafer having a defect-free surface layer and excellent gettering ability in the entire wafer surface, wherein a minimum value of an oxygen precipitate density in the annealed wafer plane is $5 \times 10^8/cm^3$ or more, and an oxygen precipitate density radial distribution variation is 0.5 or less (as defined below).

The present disclosure also relates to
(2) a method for manufacturing an annealed wafer, comprising annealing a silicon single crystal substrate that does not include a V region (i.e., a region in which volume density of voids having a size of 50 nm or more is $1 \times 10^5/cm^3$ or more) and an I region (i.e., a region in which density of dislocation pits having a size of 1 μm or more is $10/cm^2$ or more) as defect regions, and that does not include a region in which the size of voids is 50 nm to 150 nm and the density of the voids is $10^4/cm^3$ or more and $10^5/cm^3$ or less.

Furthermore, the present disclosure relates to
(3) the method for manufacturing an annealed wafer, as described in (2), wherein a silicon single crystal is grown by the Czochralski method with crystal growth conditions during manufacturing as follows:
a V/G upper limit value (mm$^2$/° C. min) is $1.6 \times \exp(1.0 \times 10^{-15} \times \text{nitrogen concentration (atoms/cm}^3)) \times (V/G)crit$ and
a V/G lower limit value (mm$^2$/° C. min) is $\exp(-7.1 \times 10^{-16} \times \text{nitrogen concentration (atoms/cm}^3)) \times (V/G)crit$
(wherein, V is a pulling speed (mm/min); G is a mean temperature gradient (° C./mm) in a crystal growth axial direction from a melting point to 1350° C.; (V/G)crit is a lower limit value of V/G which does not include the I region as a defective region in the silicon single crystal to which nitrogen is not doped, wherein the I region is a region to which excessive interstitial atoms are introduced from solid-liquid interface during crystal growth and a dislocation pit is generated);
a substrate is sliced from the nitrogen-doped grown silicon single crystal in which the nitrogen concentration is $1 \times 10^{14}$ atoms/cm$^3$ or more and $5 \times 10^{15}$ atoms/cm$^3$ or less and serves as a substrate; and
the substrate is subjected to heat treatment at 1150° C. or more and 150° C. or less for 10 minutes or more and two hours or less in a rare gas having an impurity of 5 ppm or less or in a non-oxidizing atmosphere in which an oxide film thickness after the heat treatment is suppressed to 2 nm or less.

The present disclosure also relates to
(4) the method for manufacturing an annealed wafer described in (3), wherein the crystal growth conditions, for manufacturing the silicon single crystal by the Czochralski method, include a cooling rate of 4° C./minute or more during cooling between 1100° C. and 1000° C.

[Results for the Present Discloser]
According to the manufacturing method of the present disclosure, conventional silicon single crystal manufacturing apparatuses according to the CZ method can be used without modification, and complex manufacturing processes are not performed; therefore, high-quality silicon semiconductor substrates can be reliable supplied without greatly increasing the cost.

In addition, according to the present disclosure, the annealed wafer can be provided with no non-uniformity of oxygen precipitates and with excellent device properties. In addition, the annealed wafer is an optimal substrate for manufacturing a substrate for MOS devices that require a high degree of integration and high reliability.

[Best Mode]

Hereinafter, best modes for carrying out the methods of the present disclosure will be described.

First, a crystal manufacturing method for achieving radial uniformity of oxygen precipitates will be described.

The oxygen precipitate density of an annealed wafer using a nitrogen-doped substrate depends on the nitrogen concentration; and the higher the nitrogen concentration, the higher the oxygen precipitate density. This is because, when nitrogen is added as a dopant, oxygen precipitation nuclei which are stable even at a high temperature are formed in the substrate, and they are not diminished, but rather remain after annealing. In the annealed wafer in which oxygen precipitation nuclei remain, oxygen precipitates are formed in the heat treatment of the subsequent device step. The number of the oxygen precipitation nuclei that are stable even at a high temperature is dependent on the nitrogen concentration. Therefore, when the nitrogen concentration is increased, the oxygen precipitate density is also increased. When the nitrogen concentration is $5 \times 10^{14}$ atoms/cm$^3$ or more, the oxygen precipitate density becomes $5 \times 10^{8}$/cm$^3$. Therefore, gettering ability for heavy metals such as Fe, Ni, and Cu is promoted even in low-temperature device processing heat treatment wherein the highest temperature is 1100° C. or less.

As a result of detailed research, the following index was obtained for radial distribution of oxygen precipitates. Specifically, when the oxygen precipitate density is measured in the radial direction of an annealed wafer, and when an oxygen precipitate density radial distribution variation expressed by the following expression is more than 0.5, decrease in device yield due to insufficient gettering becomes notable. The oxygen precipitate density radial distribution variation can be obtained by the following expression.

Oxygen precipitate density radial distribution variation= (oxygen precipitate density maximum value−oxygen precipitate density minimum value)/oxygen precipitate density maximum value When the oxygen precipitate density radial distribution after heat treatment of an annealed wafer, wherein a nitrogen-doped substrate is used as a substrate, was researched in detail, it was found that locations where the oxygen precipitate density is lower than surrounding areas were present. When looking at an oxygen precipitate density profile, that part appears to be depressed like a valley. Therefore, hereinafter, such region where the oxygen precipitate density is low will be referred to as a precipitate valley region. The precipitate valley region is present when the oxygen precipitate density radial distribution variation has a value of 0.5 or more.

It was found that, in the case of an annealed wafer using nitrogen-doped crystal, the precipitate valley region corresponds closely with a defect region. A result is that, when the crystal diameter is increased to 300 mm, controlling defect regions in the crystal plane becomes difficult, and the radial distribution of the oxygen precipitate density also becomes uneven since the cooling rate during crystal growth is different outside and inside the crystal.

Hereinafter, after describing the relation between the nitrogen concentration and V/G and defective regions in a substrate, the relation of the precipitate valley region of the annealed wafer to the defect region of the substrate will be described.

Figure 1B:
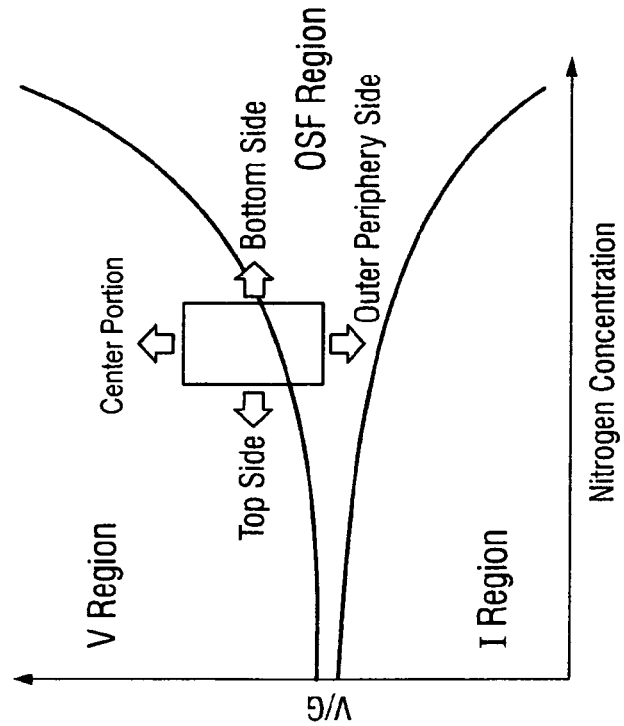

FIGS. 1(a) and 1(b) are explanatory drawings for explaining the relation between defect regions and a nitrogen concentration in a silicon ingot which is pulled in accordance with the Czochralski (CZ) method. FIG. 1(a) is a graph showing the relation between the defect regions and nitrogen concentration. In FIG. 1(a) the defect regions are the V Region, OSF region, and the I Region that are present in a substrate used as a substrate before annealing. FIG. 1(b) is a schematic drawing showing the defect regions and nitrogen concentration distribution in a silicon crystal ingot 200 during pulling.

In the CZ method, as understood, the single crystal ingot 200 is grown while it is gradually pulled up from molten silicon 201. Then, in a substrate obtained by slicing the ingot 200, three types of defect regions (V region, OSF region, and I region) are present, as shown in FIG. 1(a),.

The V region is a region to which excessive vacancies are introduced from a solid-liquid interface during crystal growth, and voids formed by aggregations of the atomic vacancies are present therein.

The OSF region is a region in which OSF is generated when a silicon single crystal wafer is subjected to oxidation heat treatment. Herein, the OSF is disk-like stacking fault having a diameter of about several pm wherein oxygen precipitates (OSF nuclei) are present at the center thereof. The OSF is formed when interstitial atoms, which are generated from an oxide film/silicon interface when oxidation heat treatment is carried out, aggregate around the OSF nuclei. The OSF nuclei are oxygen precipitates with a particular property for collecting interstitial atoms, and it is believed that they may already be present in the substrate at the point immediately after crystal growth. Since the size of the OSF nuclei is small (conceivably, 10 nm or less), they are not detected by existing evaluation methods such as foreign matter measurement and infrared tomography. Therefore, the presence of the OSF can be confirmed for the first time when oxidation heat treatment is carried out.

The I region is a region to which excessive interstitial atoms are introduced from the solid-liquid interface during crystal growth, and dislocation loops are present therein, formed by the gathering of the interstitial atoms. In the I region, oxygen precipitation does not readily occur; therefore, in an annealed wafer using a substrate containing an I region, a region is created having low oxygen precipitate density.

Defective regions of a substrate are determined by the nitrogen concentration and crystal growth conditions of V/G (wherein, V: pulling speed (mm/min), G: mean temperature gradient in crystal growth axial direction from a melting point to 1350° C. (° C./mm)) (V. V. Voronkov, K. Crystal Growth, 59 (1982) 625 (which is hereby incorporated herein for all purposes), and M. Iida, W. Kusaki, M. Tamatsuka, E. Iino, M. Kimura and S. Muraoka, Defect in Silicon, ed. T. Abe, W. M. Bullisetal (ECS., Pennington N.J., 1999) 499 (which is hereby incorporated herein for all purposes)).

In the case of a substrate sliced from silicon single crystal that is not nitrogen-doped, when V/G is larger than a particular value, atomic vacancies are excessively introduced, and the V region or the OSF region is formed in the substrate. When V/G is smaller than a particular value, interstitial atoms are excessively introduced, and the I region is formed in the substrate. Meanwhile, nitrogen affects the amount of atomic vacancies and interstitial atoms introduced from the solid-liquid interface. Therefore, the defect regions of a substrate sliced from nitrogen-doped silicon single crystal can be shown in a two-dimensional defective region map wherein the nitrogen concentration and V/G are serving as two axes as shown in FIG. 1(a).

As shown in FIG. 1(a), a nitrogen-doped-crystal ingot has certain dimensions in the nitrogen concentration and V/G as shown by a rectangular region (referred to as "growth condition region") in the nitrogen concentration-V/G diagram. This is because, as shown in FIG. 1(b), the nitrogen concentration is higher in the lower part or bottom side of the ingot 200 of the nitrogen-doped crystal as compared to the top side, and V/G is low in the crystal outer periphery portion or side as compared with the center portion.

Nitrogen addition to a CZ-silicon single crystal is carried out by use of a nitrogen-doped melt; however, it is believed that the percentage (segregation coefficient) of the nitrogen concentration incorporated from the melt to the crystal upon solidification is very small. Therefore, most of the nitrogen in the melt remains in the melt, and the nitrogen concentration in the melt is increased as crystal growth progresses. As a result, the nitrogen concentration becomes higher in the lower portion of the crystal. Meanwhile, the mean temperature gradient G (° C./mm) in the crystal growth axial direction from the melting point to 1350° C. depends on crystal cooling power; however, G is larger in the crystal outer peripheral portion since the crystal outer peripheral portion is generally readily cooled. As a result, V/G is lower in the crystal outer peripheral portion.

When the range of growth conditions of a nitrogen-doped crystal ingot is overlapped with the two-dimensional defect region map wherein the nitrogen concentration and V/G are serving as two axes, the defect regions of the crystal can be described. For example, in a crystal with growth conditions in the ranges shown in FIG. 1(a), the V region is present in the crystal center portion, and the OSF region is present in the crystal outer peripheral portion. When the nitrogen concentration range is fixed, and V/G is increased, the void region is spread over the entire substrate surface. When V/G is reduced, the void region shrinks to the substrate center, and the I region is spread over the entire substrate surface. When V/G is fixed, and the nitrogen concentration is increased, the OSF region is generated from an outer peripheral portion and spread to the entire substrate surface.

The relation between precipitate valley regions in an annealed wafer and defect regions in a substrate were researched; and, as a result, it was found out that, as shown in FIGS. 2(a) and 2(b), the precipitate valley region has a close relation with the defect regions in the substrate. Specifically, a precipitate valley region of the annealed wafer is generated in the location corresponding to the V region boundary of the substrate, and the region is slightly expanded to the V region side and the OSF region side.

FIG. 2(a) is a graph showing the relation between the nitrogen concentration and V/G In the graph, in a growth condition region 1, the nitrogen concentration is $5 \times 10^{13}$ to $1 \times 10^{14}$ atoms/cm$^3$ and V/G (relative value) is 1.3 to 2.1; in a growth condition region 2, the nitrogen concentration is $1 \times 10^{14}$ to $5 \times 10^{14}$ atoms/cm$^3$ and V/G (relative value) is 1.3 to 2.1; in a growth condition region 3, the nitrogen concentration is $1 \times 10^{15}$ to $5 \times 10^{15}$ atoms/cm$^3$ and the V/G (relative value) is 1.3 to 2.1; and, in a growth condition region 4, the nitrogen concentration is $1 \times 10^{15}$ to $5 \times 10^{15}$ atoms/cm$^3$ and V/G (relative value) is 1.0 to 0.6.

FIG. 2(b) is a chart showing oxygen precipitate radial distribution in a substrate plane, for an oxygen precipitate density of at least $5 \times 10^8$/cm$^3$ or less than $5 \times 10^8$/cm$^3$ ("o" means at least $5 \times 10^8$/cm$^3$ and "x" means less than $5 \times 10^8$/cm$^3$ (hereinafter, shown the same in similar drawings)), and whether the oxygen precipitate density radial distribution variation is equal to or less than 0.5 or not ("o" means it is equal to or less than 0.5, and "x" means it is larger than 0.5 (hereinafter, shown the same in similar drawings)). As shown in the chart, when the growth condition region includes the precipitate valley region, the oxygen precipitate density radial distribution variation exceeds 0.5.

In the case of the growth condition region 4 in FIG. 2(a), since the precipitate valley region is not included in substrates, the oxygen precipitate density radial distribution variation of 0.5 or less can be achieved. However, in order to satisfy these conditions, V/G has to be reduced, in other words, the crystal pulling speed V has to be reduced. Reducing the crystal pulling speed V is not preferred in terms of manufacturing since productivity is reduced.

As described above, in conventional manufacturing conditions, the V/G range which can achieve precipitate density radial uniformity was extremely narrow, which was inconvenient in practice. Therefore, in order to find manufacturing conditions that can expand the V/G range that achieves precipitate density radial uniformity, research was focused on crystal growth parameters other than the nitrogen concentration and V/G. As a result, it was found that setting the cooling rate of the crystal during crystal growth to 4° C./minute or more between 1100° C. and 1000° C. affects the oxygen precipitate radial distribution.

Figures 3A, 3B:
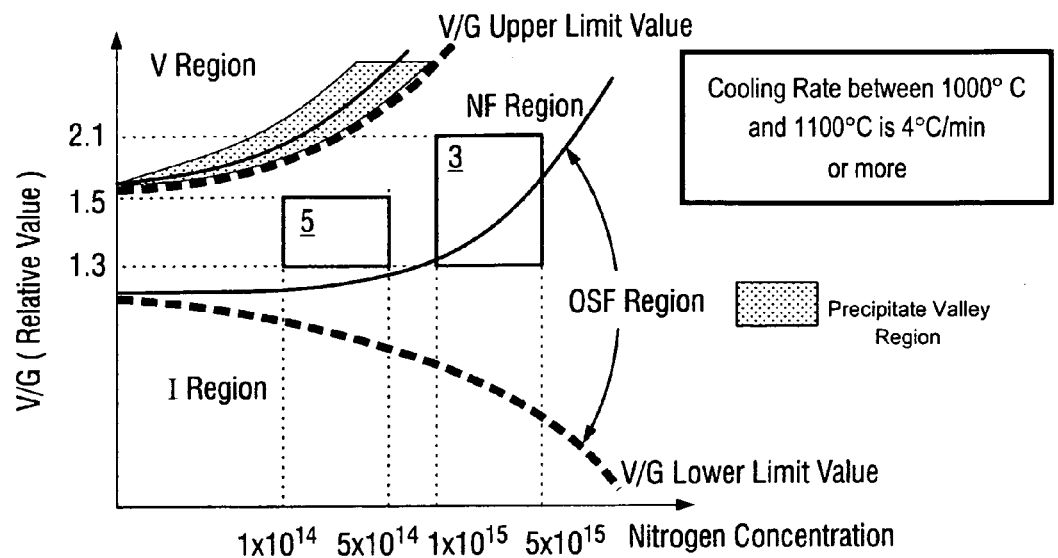
FIGS. 3(a) and 3(b) are explanatory drawings for explaining conditions for manufacturing annealed wafers in which oxygen precipitates are uniform.

FIGS. 3(a) and 3(b) are explanatory drawings for explaining conditions for manufacturing annealed wafers in which oxygen precipitates are uniform. FIG. 3(a) is a graph showing the relation between the nitrogen concentration and V/G, and FIG. 3(b) is a chart showing defect distribution, whether the oxygen precipitate density is equal to or more than $5 \times 10^8$/cm$^3$ or not, and whether the oxygen precipitate density radial variation is equal to or less than 0.5 or not. In a shown growth condition region 5, the nitrogen concentration is $1 \times 10^{14}$ to $5 \times 10^{14}$ atoms/cm$^3$ and V/G (relative value) is 1.3 to 1.5. Herein, an NF region in FIG. 3(a) is a new defect region found between a V region boundary and an OSF region boundary. This region is found for the first time when the cooling rate of the crystal during crystal growth is 4° C./minute or more between 1100 and 1000° C., and it is a region in which OSF and voids are not present.

As is clear from comparison between FIG. 2 and FIG. 3, when the cooling rate of a crystal is 4° C./minute or more between 1100 and 1000° C., while the boundary positions of the OSF region do not change, the boundary of the V region is shifted in the lower-nitrogen and higher-V/G directions. Accordingly, the precipitate valley region is also shifted in the lower-nitrogen and higher-V/G directions. As a result, it was found out that the range of the nitrogen concentration and V/G that can maintain a uniform oxygen precipitate radial distribution is expanded in the lower-nitrogen and higher-V/G directions.

In the growth condition regions 3 and 5 of FIG. 3(a), although partly out of the OSF region, the radial distribution of oxygen precipitates is uniform because the precipitate valley region is not included therein. In other words, the oxygen precipitate radial distribution is independent of the distribution of the OSF region. In the case of the growth condition region 5, precipitate radial uniformity can be achieved by a substrate not including the OSF region.

According to conventional knowledge, for example, in Japanese Laid-Open Patent Application (kokai) No. 2003-59932, the relation between the defect region and oxygen precipitate density distribution was discussed only in relation with the OSF region. Therefore, there has been only the idea that the OSF region has to be controlled for oxygen precipitate radial distribution control. However, as a result of this research, it has been found that what controls the radial distribution of oxygen precipitates is not the OSF region, but control of the precipitate valley region associated with the V region distribution.

As a result of an opening up of the possible nitrogen concentration toward the low-nitrogen side, the nitrogen concentration range is expanded. Consequently, the oxygen precipitate density can be widely controlled in accordance with requirements from device users. As a result of an opening up of the possible V/G toward the high-V/G side, productivity of silicon single crystal can be improved since the pulling speed V can be further increased.

The range of V/G where the oxygen precipitate density radial distribution variation is equal to or less than 0.5 is between the lower boundary of the precipitate valley region and the I region boundary as shown in FIG. 3($a$). When various experimental results are put together, the above described V/G range can be expressed as a function of the nitrogen concentration. Specifically, the V/G upper limit value (mm$^2$/° C. min) is $1.6 \times \exp(1.0 \times 10^{-15} \times$ nitrogen concentration (atoms/cm$^3$))$\times$(V/G)crit, and the V/G lower limit value (mm$^2$/C. min) is $\exp(-7.1 \times 10^{-16} \times$ nitrogen concentration (atoms/cm$^3$))$\times$(V/G)crit, (wherein (V/G)crit is the V/G value corresponding to the boundary of the V region and the I region in a silicon single crystal to which nitrogen is not added.)

Figure 4A:
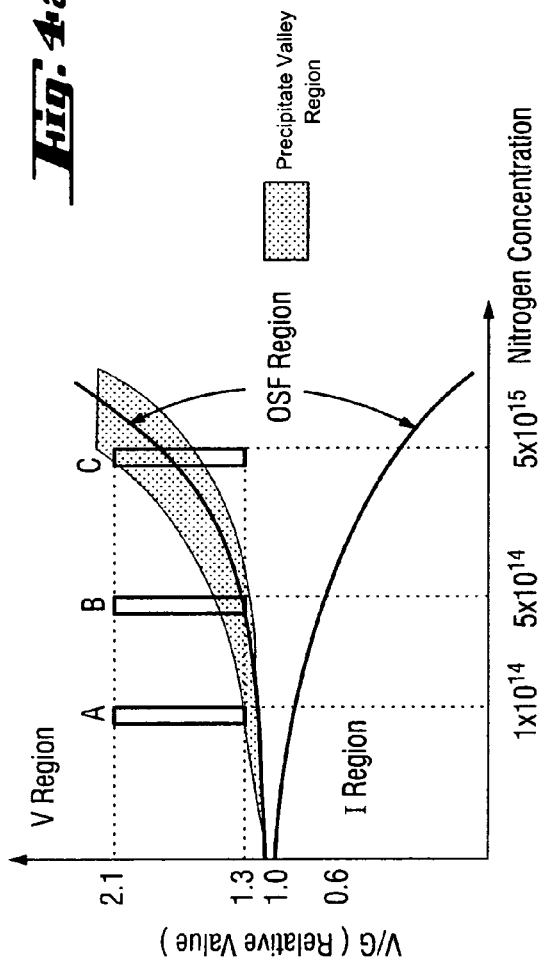
FIGS. 4(a) and 4(b) are graphs explaining radial distribution of voids and in-plane distribution of oxygen precipitates.
Figure 4B:
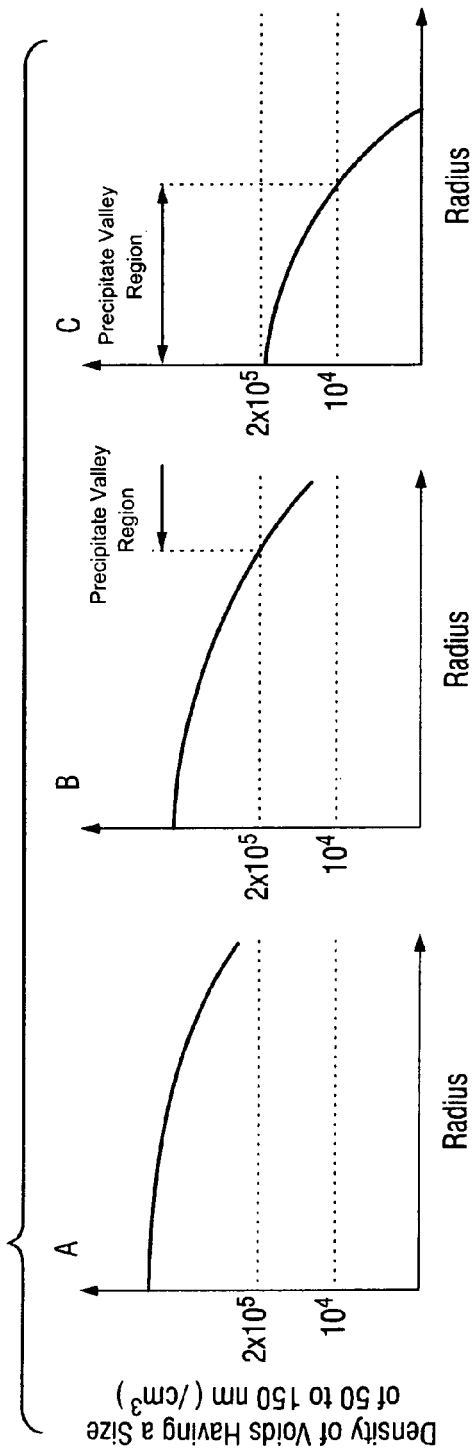

The oxygen precipitate radial distribution of a substrate and void radial distribution of a substrate are related as follows. FIGS. 4($a$) and 4($b$) are graphs explaining radial distribution of voids and radial distribution of oxygen precipitates. FIG. 4($a$) is a graph showing the relation between the nitrogen concentration and V/G, and FIG. 4($b$) includes graphs showing the resulting densities of voids, having sizes of 50 to 150 nm, for respective regions of A, B, and C, measured in the substrate radial direction.

In the A region in FIG. 4($a$), the nitrogen concentration is $1 \times 10^{14}$ atoms/cm$^3$ and V/G (relative value) is 1.3 to 2.1; in the B region therein, the nitrogen concentration is $5 \times 10^{14}$ atoms/cm$^3$ and V/G (relative value) is 1.3 to 2.1; and, in the C region therein, the nitrogen concentration is $5 \times 10^{14}$ atoms/cm$^3$ and V/G (relative value) is 1.3 to 2.1.

As shown in the graphs, it has been found that the precipitate valley region is the region in which voids having a size of 50 to 150 nm are present in the substrate in densities between $10^4$ and $2 \times 10^5$/cm$^3$. Herein, the void size is represented by a diameter of a sphere having the same volume as the mean volume of the voids. Inside the precipitate valley region is the region in which the maximum value of the void size is 150 nm or more, or the density of the voids having a size of 50 to 150 nm exceeds $2 \times 10^5$/cm$^3$. Outside the precipitate valley region is the region in which the void size is equal to or less than 50 nm, or the void density is less than $10^4$/cm$^3$. In both the inside and the outside precipitate valley region, the oxygen precipitate density is larger than the precipitate valley region.

The reason why the oxygen precipitate density of the region in which the voids having a size of 50 to 150 nm are present in the density range of to $10^4$ to $2 \times 10^5$/cm$^3$ is smaller than the surrounding area is not known. The voids are formed when atomic vacancies aggregate in a temperature zone around 1100° C. during crystal growth; however, the remaining atomic vacancies not aggregated as voids conceivably serve as nuclei of oxygen precipitates in a lower temperature zone (around 1000° C.) during crystal growth. The region in which the voids having the size of 50 to 150 nm are present in a density range of $10^4$ to $2 \times 10^5$/cm$^3$ is expected in the state wherein the remaining vacancy concentration is the smallest according to other mechanisms.

The reason that the precipitate valley region is changed in a substrate plane by increasing the crystal cooling rate of 1100 to 1000° C. may be that the radial distribution of the void density is changed by rapid cooling of 1100° C. to 1000° C.

The crystal cooling rate in the temperature zone of 1100° C. to 1000° C. during crystal growth in the CZ method may cause the shift of the precipitate valley region shown in FIG. 4 for the below reason.

Supersaturated atomic vacancies introduced from a solid-liquid interface upon crystal growth aggregate at about 1100° C., thereby forming voids. When the crystal cooling rate of 1100 to 1000° C. is high, the atomic vacancies have insufficient time to aggregate, and the void size becomes small. As a result, the region in which the voids having a size of 50 to 150 nm are present in the density range of $10^4$ to $2 \times 10^5$/cm$^3$ is shifted, as shown in the charts of nitrogen concentration v. V/G. In the NF region between the V region and OSF region shown in FIG. 3$a$, voids having a size of 50 nm or less are conceivably present.

Specific examples of silicon single crystal manufacturing and annealed wafer manufacturing will next be described.

As a silicon single crystal manufacturing method, the CZ method in which a crystal is pulled from a melt in a crucible while growing the crystal is widely performed. In such a silicon single crystal manufacturing method, in the first place, polycrystalline silicon is put in a crucible made of quartz as a raw material, and the raw material is melted by a heater (in-furnace structures such as the heater and a heat insulating material are collectively referred to as a hot zone) surrounding it. Then, a seed crystal is lowered from above the melt in the crucible and brought into contact with the melt surface. A single crystal having a predetermined diameter is fabricated by upwardly pulling up the seed crystal while rotating the seed crystal and controlling the pulling speed V. As the crystal grows, the silicon melt decreases; and, in accordance with this, crystal growth conditions such as heat conduction and flow in the silicon melt are varied. In order to stabilize crystal growth by maintaining these conditions constant as much as possible, various arrangements have been made in actual crystal manufacturing steps. For example, generally, the crucible position is pulled up in accordance with the pulled crystal weight in order to keep the position of silicon melt surface constant with respect to the heater during crystal pulling. The heat transition conditions of the crystal side, in the process in which the crystal is grown, vary to an extremely small degree compared with the melt side. The heat transition conditions are generally determined by the furnace structure and the hot zone structure in the furnace and are slowly varied a small amount in accordance with the crystal length.

Generally, the temperature gradient G in the crystal growth interface is not uniform in a crystal plane. The crystal-side temperature gradient in the crystal growth interface is larger in the crystal outer peripheral portion than the crystal center portion. This is for the reason that the crystal side surface is more readily cooled by radiation cooling from the crystal side surface. Therefore, even at a constant pulling speed V, V/G becomes lower in the crystal outer peripheral portion, and the OSF region, which causes epilayer defect generation, is readily generated in the crystal outer peripheral portion. The crystal-side temperature gradient G in the crystal pulling direction in the crystal growth interface is strictly measured by repeating experiments in which, for example, crystal growth is actually carried out by inserting a thermocouple in a crystal.

The V/G of the crystal growth interface and the crystal cooling rate at 1100 to 1000° C. during crystal growth can be controlled by respectively changing G in the solid-liquid interface and G in the temperature zone of 1100 to 1000° C.; however, in order to independently control them, the structure of the pulling furnace has to be changed.

In order to reduce V/G, the pulling speed has to be reduced; however, as a result, the crystal cooling rate at 1100° C. to 1000° C. during crystal growth is also reduced. Therefore, in order to reduce V/G of the crystal growth interface while increasing the crystal cooling rate at 1100° C. to 1000° C. during crystal growth, special treatment, such as increasing the cooling power of a heat shielding plate that is placed so as to surround the crystal, is required.

In order to manufacture a nitrogen-doped CZ-silicon single crystal, for example, a nitrogen gas may be introduced during raw-material melting or a nitride may be incorporated into a deposited silicon substrate by the CVD method or the like during raw material melting. The segregation coefficient, k, which is a rate at which an impurity is incorporated in a crystal after solidification with respect to the concentration in the melt, is $7 \times 10^{-4}$ in the case of nitrogen (W. Zulehner and D. Huber, Crystal Growth, Properties and Applications, p28, Springer-Verlag, New York, 1982 (which is hereby incorporated herein for all purposes)).

The nitrogen concentration introduced from the melt to the crystal can be determined from the following expression by use of the solidification rate g=(weight of crystallized silicon)/(initial melt weight) of the crystal at that point.

(nitrogen concentration in crystal)=k×(initial melt nitrogen concentration)×$(1-g)^{k-1}$ This relation is generally maintained constant regardless of conditions such as the structure of the pulling furnace and the pulling speed; therefore, nitrogen concentration control in the crystal can be generally uniquely controlled by the nitrogen concentration of the initial melt.

In the manufacturing of a silicon single crystal according to the CZ method, quartz is used as the crucible. The quartz crucible melts into the silicon melt little by little during crystal pulling; therefore, oxygen is present in the silicon melt. The oxygen melted from the quartz crucible moves due to flow and diffusion of the silicon melt, and the greater part thereof evaporates from the melt surface in the form of an SiO gas. However, a part thereof is introduced into the crystal. The oxygen introduced at a high temperature is supersaturated in the process of the crystal cooling, thereby causing aggregation and forming minute oxygen clusters during crystal cooling. These clusters serve as precipitation nuclei, are precipitated as SiOx in the process of device heat treatment of the subsequently processed silicon single crystal wafer, and become oxygen precipitates.

Substrates for annealed wafers are generated from a resultant silicon single crystal ingot. Generally, the silicon single crystal is sliced by use of a wire saw or an inner blade slicer, and substrates are fabricated through steps of chamfering, etching, and mirror polishing. When an additional heat treatment step for oxygen precipitation acceleration or defect elimination is to be added, generally, a heat treatment process is carried out thereafter. However, in the case of the substrate described in the present disclosure to which nitrogen is added, such step is not required, and it can be fabricated in the steps same as a general silicon substrate.

The heat-treating furnace which carries out annealing may be a commercially available furnace, and no particular regulation is imposed thereon. However, any resulting oxide film should not be allowed to grow 2 nm or more during heat treatment. This is because, when the oxide film adheres on the surface, contraction/elimination of defects during annealing is inhibited. Specifically, an arrangement such as reducing the amount of impurities incorporated in an atmospheric gas during heat treatment as much as possible or reducing inclusion of air from the surrounding area as much as possible upon insertion of a wafer into a furnace is required. The gas used for the atmosphere may be a rare gas such as argon in which, for example, impurities are suppressed to 5 ppma or less.

The members used to hold a wafer typically are quartz or the like. These members are significantly deteriorated when the annealing temperature is increased too much. Therefore, they have to be frequently replaced, which is a factor of increased manufacturing cost. The annealing temperature is preferably 1250° C. or less. Lowering the annealing temperature too much slows the contraction speed of defects; therefore, elimination takes time, and productivity is lowered. The annealing temperature is preferably 1150° C. or more. When the annealing time is short, defects remain in the substrate surface since the defects are not sufficiently eliminated when the annealing time is short. When the annealing time is long, productivity is lowered since the time required for one annealing is lengthened. Therefore, the annealing time is typically between about 10 minutes and about two hours or less.

The oxygen precipitation nuclei, formed in a nitrogen-doped substrate that is used as a substrate, are thermally stable by virtue of the effect of nitrogen and are not eliminated even during rapid temperature increase during the annealing step. An additional heat treatment step for oxygen precipitation acceleration or defect elimination may be carried out during the annealing step. In that case, before the annealing step, heat treatment is carried out at a temperature lower than that of the annealing step. However, when such additional step is added in that manner, the time of the entire annealing step is lengthened; thus, productivity is lowered, and manufacturing cost is increased. In this regard, in the case of the nitrogen-doped substrate described in the present disclosure, such step is not required.

EXAMPLE

Silicon single crystal manufacturing apparatuses used in this example are those used in general silicon single crystal manufacturing according to the CZ method. The apparatuses are a first pulling furnace in which a heat shielding plate is cooled in a particular method in order to increase the cooling speed of 1100 to 1000° C. and a second furnace having a general cooling speed. When the present disclosure is to be carried out, no particular limitations are imposed on the pulling furnaces as long as the growth conditions of the present disclosure can be carried out.

A silicon single crystal grown by utilizing the apparatuses has a conduction type: p-type (boron doped) and a crystal diameter: 8 inches (200 mm).

Nitrogen doping was performed by putting substrates having nitride films in silicon melts.

Relative V/G values are defined in the following manner. In a pulling furnace having the same structure as the furnace in which the nitrogen doped crystal was pulled, crystals to which nitrogen and carbon were not added were pulled at various pulling speeds V, radial distribution of distribution pits was checked by the method described later, and the boundary position of the I region was obtained. For example, when the pulling speed is low, the wafer outer peripheral side is in the I region, and dislocation pits are generated therein. In that case, the in-plane distribution of the dislocation pits was checked, and the position where the dislocation pit density is lower than 10/cm² was set as the boundary of the I region. The V/G value at that position is set as (V/G)crit, and a relative V/G value of the nitrogen-added crystal pulled in the pulling furnace having the same structure is set as (V/G)/(V/G)crit. In other words, when the relative V/G value is 1, V/G is equal to (V/G)crit.

Crystals to which nitrogen is not added are pulled from the first pulling furnace and the second pulling furnace. The relative V/G values are obtained, and a nitrogen concentration v. V/G chart is generated.

As a cooling rate from 1100 to 1000° C. during crystal growth, when the minimum value among crystal growth axial direction temperature gradients in the range of 1100 to 1000° C. was G2 (° C./mm), V×G2 was calculated and it was employed as a representative value.

Substrates (silicon wafers) were sliced from the same part in the single crystals, and the substrates after mirror processing were subjected to annealing, thereby producing annealed wafers.

The nitrogen concentrations were measured by using a secondary ion mass spectrometer (SIMS) after sampling samples from the annealed wafers and performing polishing of 20 µm in order to remove nitrogen out diffusion layers of the surfaces thereof.

In the V region of the substrates, excessive atomic vacancies were introduced from liquid-solid interfaces during crystal growth, and, as a result, voids are generated. Therefore, the V region of the substrates can be specifically defined by the density of the voids.

Regarding the voids in the substrates, void radial distribution of the substrates may be measured by use of LSTD scanner (MO-6) produced by Mitsui Mining and Smelting Co., Ltd., which is a commercially available defect evaluation apparatus. This MO-6 emits a visible-light laser from the Brewster angle, and detects a scattered image of p-polarization as a defect image by a camera disposed in the vertical direction. Since the laser permeates only as much as 5 µm from the substrate surface, defects in the depth of 5 µm from the substrate surface can be measured. Upon measurement, the detection sensitivity was adjusted so that a void having a size of 50 nm or more when converted into a sphere can be measured. The volume density of the voids was calculated from the area density of the measured voids and the measurement depth 5 µm. Then, the region where the volume density of the voids was equal to or more than $1 \times 10^5$/cm³ was determined as the V region.

Meanwhile, in the I region of the substrates, excessive interstitial atoms were introduced from the solid-liquid interface during crystal growth, and, as a result, they appear as dislocation pits. Therefore, the I region can be defined by the density of the dislocation pits.

The dislocation pits were measured according to the below method. First, the substrate is etched by 5 µm by a Wright etch solution, and the number of rhombus-shaped or stream-line-shaped dislocation pits that were generated in the surface and had a size of 1 µm or more was counted through observation by an optical microscope. The measurement was carried out at a pitch of 10 mm in the radial direction of the substrate, and the dislocation pit area density was calculated from the visual field area. Then, the area where the dislocation pit density is 10/cm² or more was determined as the I region.

The OSF evaluation of the substrate was performed according to the below method. First, the substrate was subjected to oxidation treatment in a vapor-containing oxygen atmosphere at 1100° C. for an hour. Then, after an oxide film was removed by a hydrofluoric acid, it was etched by an amount corresponding to the thickness of 5 µm by the Wright etch solution, and elliptical, half-moon-like, or rod-like OSF pits formed on the surface were observed by an optical microscope. The number of the OSF pits was counted by scanning a visual field having a diameter of 2.5 mm in the substrate diameter direction by an optical microscope, and the OSF area density (pits/cm²) was by dividing the number of the OSF pits by the observation area. The region where the OSF area density is equal to or more than 100/cm² was determined as the OSF region.

The oxygen precipitation characteristics evaluation of the annealed wafer was carried out according to the below method. First, an annealed wafer was subjected to double heat treatment at 780° C. for three hours and at 1000° C. for sixteen hours. Then, the wafer was cleaved, and the internal oxygen precipitate densities were measured by BMD analyzer MO-4 produced by Mitsui Mining and Smelting Co., Ltd. The positions of the measurement points in the plane were located from the substrate center to 10 mm from the edge at a pitch of 10 mm. The minimum value of the obtained oxygen precipitate densities and the oxygen precipitate density radial distribution variation represented by the below expression were obtained.

The oxygen precipitate density radial distribution variation=(oxygen precipitate density maximum value−oxygen precipitate density minimum value)/oxygen precipitate density maximum value The evaluation results including comparative examples are shown in Table 1.

TABLE 1

| Substrate Nitrogen Concentration (atoms/cm³) | Pulling Furnace | Pulling Speed V (mm/min) | Range of Relative V/G Value | | Cooling Rate between 1000–1100° C. (° C./min) | $(V/G)_1$ | $(V/G)_2$ | Precipitate Density Minimum Value (/cm³) | Precipitate Density in-plane Variation | Remarks |
|---|---|---|---|---|---|---|---|---|---|---|
| 5.0E+14 | 1 | 1.5 | 1.3 | −2.1 | 8.0 | 0.70 | 2.64 | 1.0E+09 | 0.2 | Example 1 |
| 2.0E+15 | 1 | 1.5 | 1.3 | −2.1 | 8.0 | 0.24 | 11.82 | 4.0E+09 | 0.3 | Example 2 |
| 4.0E+15 | 1 | 1.5 | 1.3 | −2.1 | 8.0 | 0.06 | 87.36 | 9.0E+09 | 0.2 | Example 3 |
| 1.0E+15 | 1 | 0.8 | 0.6 | −1.0 | 4.0 | 0.49 | 4.35 | 2.0E+09 | 0.1 | Example 4 |
| 3.0E+15 | 1 | 0.8 | 0.6 | −1.0 | 4.0 | 0.12 | 32.14 | 4.0E+09 | 0.1 | Example 5 |
| 5.0E+15 | 1 | 0.8 | 0.6 | −1.0 | 4.0 | 0.03 | 237.46 | 9.0E+09 | 0.2 | Example 6 |
| 1.0E+14 | 1 | 1.0 | 1.3 | −1.5 | 5.0 | 0.93 | 1.77 | 5.0E+08 | 0.2 | Example 7 |
| 2.0E+14 | 1 | 1.0 | 1.3 | −1.5 | 5.0 | 0.87 | 1.95 | 6.0E+08 | 0.3 | Example 8 |
| 5.0E+14 | 1 | 1.0 | 1.3 | −1.5 | 5.0 | 0.70 | 2.64 | 1.0E+09 | 0.2 | Example 9 |
| 1.0E+14 | 1 | 0.8 | 1.0 | −1.2 | 4.0 | 0.93 | 1.77 | 5.0E+08 | 0.1 | Example 10 |
| 2.0E+14 | 1 | 0.8 | 1.0 | −1.2 | 4.0 | 0.87 | 1.95 | 7.0E+08 | 0.2 | Example 11 |
| 5.0E+14 | 1 | 0.8 | 1.0 | −1.2 | 4.0 | 0.70 | 2.64 | 1.0E+09 | 0.1 | Example 12 |

TABLE 1-continued

| Substrate Nitrogen Concentration (atoms/cm³) | Pulling Furnace | Pulling Speed V (mm/min) | Range of Relative V/G Value | | Cooling Rate between 1000–1100° C. (° C./min) | $(V/G)_1$ | $(V/G)_2$ | Precipitate Density Minimum Value (/cm³) | Precipitate Density in-plane Variation | Remarks |
|---|---|---|---|---|---|---|---|---|---|---|
| 5.0E+13 | 1 | 0.8 | 1.3 | −2.1 | 4.0 | 0.97 | 1.68 | 1.0E+08 | 0.9 | Comp.Ex. 1 |
| 1.0E+14 | 1 | 0.8 | 0.6 | −1.0 | 4.0 | 0.93 | 1.77 | 5.0E+08 | 0.6 | Comp.Ex. 2 |
| 1.0E+14 | 1 | 1.5 | 1.3 | −2.1 | 4.0 | 0.93 | 1.77 | 5.0E+08 | 0.7 | Comp.Ex. 3 |
| 1.0E+15 | 2 | 1.2 | 1.3 | −2.1 | 1.0 | 0.49 | 4.35 | 1.0E+09 | 0.8 | Comp.Ex. 4 |

$(V/G)_1$: $\exp(-7.1 \times 10^{-16} \times$ Nitrogen Concentration [atoms/cm³])
$(V/G)_2$: $1.6 \times \exp(1.0 \times 10^{-15} \times$ Nitrogen Concentration [atoms/cm³])

Herein, $(V/G)_1$ and $(V/G)_2$ are the V/G lower limit value and the V/G upper limit value, respectively, which were obtained from the nitrogen concentrations of the pulled crystals by using respective expressions.

The annealed wafers that satisfy the conditions that the substrate nitrogen concentration is equal to or more than $5 \times 10^{14}$ atoms/cm³ and equal to or less than $5 \times 10^{15}$ atoms/cm³ and the range of the relative V/G value is equal to or more than $\exp(-7.1 \times 10^{-16} \times$ nitrogen concentration (atoms/cm³) and equal to or less than $1.6 \exp(1.0 \times 10^{-15} \times$ nitrogen concentration (atoms/cm³)), and using the substrates of which cooling rate of 1100 to 1000° C. is equal to or more than 4° C./minute, had the oxygen precipitate density minimum value of $5 \times 10^8$/cm³ or more and the oxygen precipitate density radial distribution variation of 0.5 or less, and the oxygen precipitate radial distribution thereof was good. The substrate, before carrying out annealing, did not include the V region and the I region as defect regions, and the regions in which voids having a size of 50 to 150 nm were in the density range of $10^4$ to $2 \times 10^5$/cm³ were not present in the substrates.

In the examples, the OSF was not present in the substrates (substrates of the annealed wafers of Examples 1 to 3) sliced from the crystals pulled at the cooling rate of 1100 to 1000° C. of 8° C./minute by use of the first pulling furnace when the nitrogen concentration is equal to or more than $5 \times 10^{14}$ atoms/cm³ and equal to or less than $4 \times 10^{15}$ atoms/cm³ and the relative V/G was equal to or more than 1.3 and equal to or less than 2.1, and the substrates (substrates of the annealed wafers of Examples 7 to 9) sliced from the crystals at the cooling rate of 1100 to 1000° C. of 5° C./minute when the nitrogen concentration was equal to or more than $1 \times 10^{14}$ atoms/cm³ and equal to or less than $5 \times 10^{14}$ atoms/cm³ and the relative V/G was equal to or more than 1.3 and equal to or less than 1.5.

The annealed wafer having the substrate nitrogen concentration of less than $1 \times 10^{14}$ atoms/cm³ had the oxygen precipitate density minimum value of less than $5 \times 10^8$/cm³ and quality of oxygen precipitation was inferior to the Examples (Comparative Example 1).

When the minimum value of the relative V/G was less than $\exp(-7.1 \times 10^{-16} \times$ nitrogen concentration (atoms/cm³)), the I region was present in the substrate; therefore, the oxygen precipitate density radial distribution variation exceeds 0.5, and quality of oxygen precipitation was inferior to the Examples (Comparative Example 2).

When the maximum value of the relative V/G exceeded $1.6 \exp(1.0 \times 10^{-15} \times$ nitrogen concentration (atoms/cm³)), the precipitation valley region was present in the substrate; therefore, the oxygen precipitate density radial distribution variation exceeded 0.5, and quality of oxygen precipitation was inferior to the Examples (Comparative Example 3).

When the cooling rate of 1100 to 1000° C. was less than 4° C./minute, the precipitation valley region was present in the substrate, the oxygen precipitate density radial distribution variation 0.5, and quality of oxygen precipitation was inferior to the Examples (Comparative Example 4).

The embodiments and Examples of the present disclosure have been described hereinabove. However, the present disclosure is not limited to these Examples and embodiments, various modifications can be made by those skilled in the art, and such modified embodiments and Examples also includes the technical ideas of the present disclosure. Therefore, the technical range of the present disclosure is determined merely by the disclosure specifying notes according to claims which are reasonable for the above description.

We claim:

1. A method for manufacturing an annealed wafer, the method comprising the steps of:
    providing a silicon single crystal substrate having a volume density of voids with a size of 50 nm or less being less than $1 \times 10^4$/cm³, and wherein providing the silicon single crystal substrate includes growing a silicon single crystal ingot by the Czochralski method using a nitrogen dopant concentration, a relative V/G value, and a cooling rate defined over a temperature range, from 1100° C. to 1000° C., wherein the nitrogen dopant concentration is from $1 \times 10^{14}$ atoms/cm³ to $5 \times 10^{14}$ atoms/cm³, the relative V/G value is from 1.3 to 1.5, and the cooling rate is 4° C./min or more; and
    annealing the substrate.

2. The method of claim 1 further wherein the substrate has a density of dislocation pits, and wherein the density of the dislocation pits having a size of at least about 1 μm is no more than about 1.0/cm².

3. The method of claim 1, wherein
    the step of growing the silicon single crystal ingot by the Czochralski method includes using a V/G upper limit calculated as a function of the nitrogen dopant concentration and a V/G crit determined without the nitrogen dopant.

4. The method of claim 1, further wherein the step of growing the silicon single crystal ingot uses a V/G lower limit calculated as a function of the nitrogen dopant concentration and the V/G crit.

5. The method Of claim 1 further including a step of applying to the substrate a heat treatment at between about 1150° C. and about 1250° C.

6. The method of claim 5 wherein the heat treatment is applied for between about 10 minutes and about two hours.

7. The method of claim 5 wherein the heat treatment is applied in a rare gas having an impurity of no more than about 5 ppm.

8. The method of claim 5 wherein the heat treatment creates on the surface of the substrate an oxide film thickness of no more than about 2 nm.

9. A method for manufacturing an annealed wafer, the method comprising the steps of:

providing a silicon single crystal substrate having, a volume density of voids with a size of 50 nm or less being less than $1 \times 10^4/cm^3$, and wherein providing the silicon single crystal substrate includes growing a silicon single crystal ingot by the Czochralski method using a nitrogen dopant concentration, a relative V/G value, and a cooling rate defined over a temperature range from 1100° C. to 1000° C., wherein the nitrogen dopant concentration is from $1 \times 10^{14}$ atoms/cm$^3$ to $5 \times 10^{14}$ atoms/cm$^3$, the relative V/G value is from 1.3 to 1.5, and the cooling rate is 5° C./min or more; and annealing the substrate.

10. The method of claim 9 further wherein the substrate has a density of dislocation pits, and wherein the density of the dislocation pits having a size of at least about 1 μm is no more than about 10/cm$^2$.

11. The method of claim 9, wherein
the step of growing the silicon single crystal ingot by the Czochralski method includes using a V/G upper limit calculated as a function of the nitrogen dopant concentration and a V/G crit determined without the nitrogen dopant.

12. The method of claim 9, further wherein the step of growing the silicon single crystal ingot uses a V/G lower limit calculated as a function of the nitrogen dopant concentration and the V/G crit.

13. The method of claim 9 further including a step of applying to the substrate a heat treatment at between about 1150° C. and about 1250° C.

14. The method of claim 5 wherein the heat treatment is applied for between about 10 minutes and about two hours.

15. The method of claim 14 wherein the teat treatment is applied in a rare gas having an impurity of no more than about 5 ppm.

16. The method of claim 14 wherein the heat treatment creates on the surface of the substrate an oxide film thickness of no more than about 2 nm.

* * * * *